United States Patent [19]
Nishihara

[11] Patent Number: 5,414,285
[45] Date of Patent: May 9, 1995

[54] SEMICONDUCTOR DEVICE HAVING CLADDING LAYER AND PROCESS FOR PRODUCTION OF THE SAME

[75] Inventor: Toshiyuki Nishihara, Kanagawa, Japan

[73] Assignee: Sony Corporation, Tokyo, Japan

[21] Appl. No.: 3,598

[22] Filed: Jan. 13, 1993

[30] Foreign Application Priority Data

Jan. 27, 1992 [JP] Japan .................................. 4-035687

[51] Int. Cl.[6] ...................... H01L 29/68; H01L 23/48
[52] U.S. Cl. .................................... 257/301; 257/311; 257/350; 257/401; 257/618
[58] Field of Search ............... 257/301, 311, 350, 401, 257/618

[56] References Cited

U.S. PATENT DOCUMENTS

| | | | |
|---|---|---|---|
| 4,969,022 | 11/1990 | Nishimoto et al. | 257/301 |
| 4,990,463 | 2/1991 | Mori | 437/52 |
| 5,028,558 | 7/1991 | Haisma et al. | 437/62 |
| 5,096,854 | 3/1992 | Saito et al. | 437/225 |
| 5,162,881 | 11/1992 | Ohya | 257/309 |

*Primary Examiner*—Mark V. Prenty
*Attorney, Agent, or Firm*—Hill, Steadman & Simpson

[57] ABSTRACT

An SOI semiconductor device, for example, a DRAM device, wherein a dummy pattern layer of substantially the same thickness as a charge storage layer constituting part of a capacitor is formed by the same material as the layer in a cell nonformation region wherein memory cells are not formed around a cell formation region where memory cells are formed in an array. As a result, the large step-difference between the cell formation region and the cell nonformation region disappears, the surface of the smoothing layer formed under the charge storage layer and dummy pattern layer become smooth, air bubbles do not become entrained between the smoothing layer and supporting substrate, and the bonding of the smoothing layer and the supporting substrate becomes better. The dummy pattern layer preferably is fixed to a predetermined potential in a range from the ground level to the power source voltage. Further, the dummy pattern layer preferably is electrically connected to a cell plate layer stacked on the charge storage layer through a capacitor insulating film layer.

9 Claims, 10 Drawing Sheets

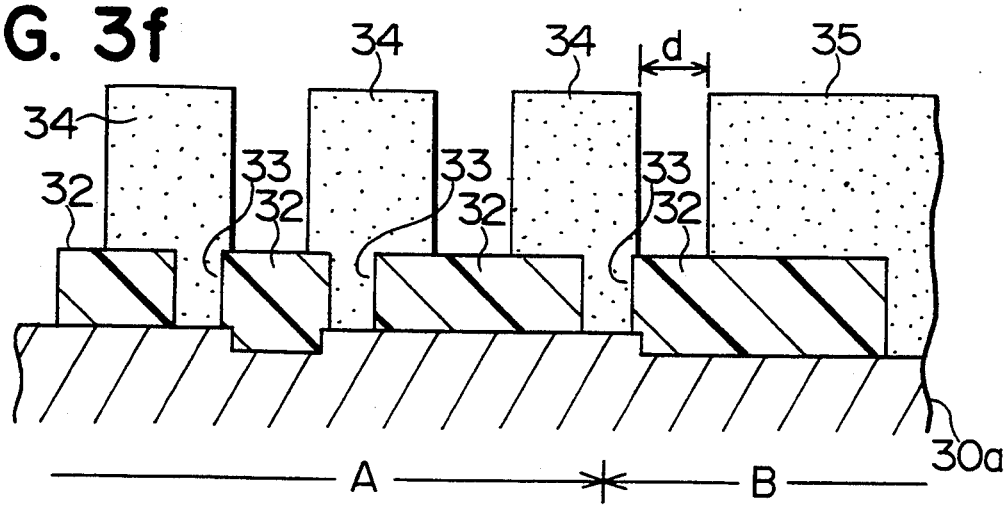
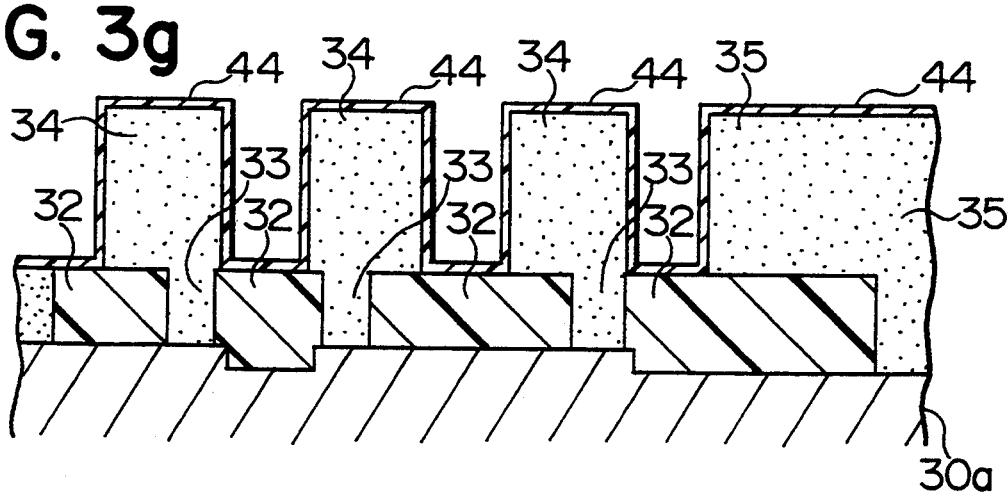
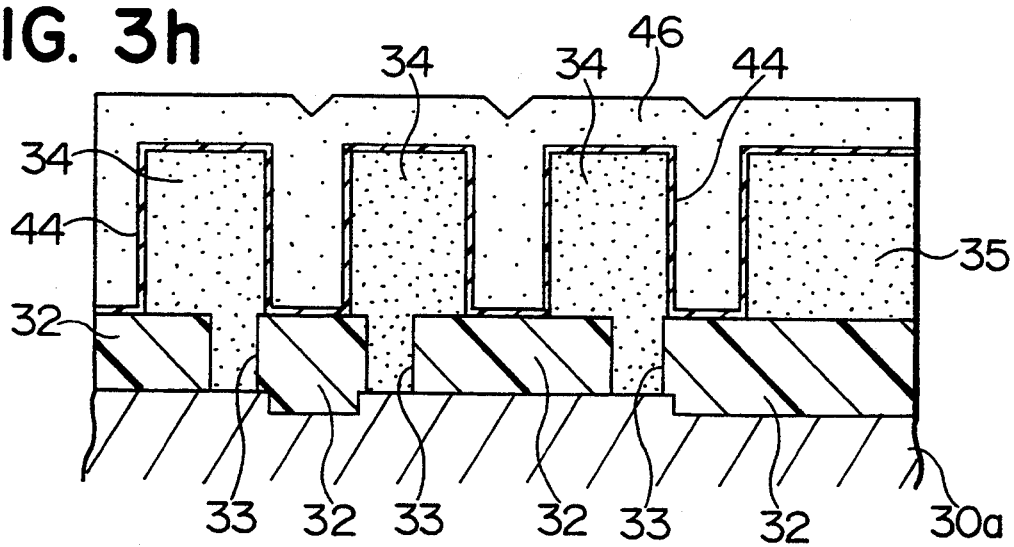

SEMICONDUCTOR DEVICE HAVING CLADDING LAYER AND PROCESS FOR PRODUCTION OF THE SAME

BACKGROUND OF THE INVENTION

1. Field of the Invention

The present invention relates to a semiconductor device, more particularly relates to a semiconductor device having a cladding layer, more preferably a semiconductor device of the silicon-on-insulator (SOI) structure, and to a process for production of the same. More specifically, the present invention relates to a semiconductor device having an SOI structure in which capacitors are arranged at predetermined intervals in an array, for example, to a dynamic random access memory (DRAM) device, and a process for production of the same.

2. Description of the Related Art

DRAM memory cells are provided with capacitors as charge storage elements. The improvement in the degree of integration of DRAMdevices has been accompanied by a reduction in the dimensions of the memory cells and a smaller area for formation of the stacked capacitors, thereby reducing the static capacitance required for the storage of data.

As one method for reducing the size of the memory cells and achieving higher densities and simultaneously securing the capacitance for the charge storage, experiments have been made to form a trench in the semiconductor substrate, forman insulating film in the trench, and form a conductive film at the two sides of the insulating film, thereby forming a capacitor (for example, U.S. Pat. No. 4,990,463).

Further, there is known a semiconductor device having an SOI structure in which a silicon monocrystal film is formed on an insulating substrate (for example, U.S. Pat. No. 5,028,558). A semiconductor device having an SOI structure has the advantage that if the integrated circuit is formed on the silicon monocrystal film, the parasitic capacitance of the wiring can be made smaller and the operating speed of the integrated circuit can be increased and, further, has the advantage that it is possible to prevent a latchup phenomenon of CMOS transistors by forming the n-channel MOS transistor and p-channel MOS transistor in a stripe form.

As one method of producing a semiconductor device having an SOI structure, a technique has been proposed for forming the semiconductor device by cladding (sticking) a supporting substrate to a smooth (flat) layer at the side of the semiconductor device where the integrated circuit is formed. Details of this cladding technique will be described later with reference to specific examples.

In this type of SOI type semiconductor device, for example, a DRAMdevice, when forming a capacitor with a large capacitance, the conductive material serving as the capacitor electrode is made to project out under the insulating layer formed under the silicon monocrystal semiconductor layer, an insulating film is formed on this conductive electrode, and a conductive layer serving as the counter electrode is formed thereon. In other words, in an SOI type DRAMdevice, in contrast to the above-mentioned trench structure, when forming a capacitor, the capacitor electrode layer, insulating film, and capacitor counter electrode are formed in a projecting manner.

A partial sectional view of a DRAMdevice is shown in FIG. 1 as an example of a conventional semiconductor having an SOI structure formed by the cladding method.

In the DRAMdevice shown in FIG. 1, a monocrystal semiconductor layer 2 wherein two diffusion regions of a MOS transistor, that is, the drain region and source region are to be formed, is formed on the top of a silicon dioxide ($SiO_2$) insulating film layer 4, resulting in an SOI structure.

Underneath the insulating film layer 4, a capacitor electrode conductive layer (storage node) 6 functioning as one of the capacitor electrodes is formed, in a projecting manner. A capacitor insulating film 10 is laid over the capacitor electrode conductive layer 6. A conductive cell plate layer 12 functioning as the other capacitor electrode (counter electrode) is formed burying the recesses between the projections of the conductive layer 6 and covering the insulating film 10. A charge storage capacitor is formed by the capacitor electrode conductive layer 6, the capacitor insulating film 10, and the conductive cell plate layer 12.

The capacitor electrode conductive layer 6 is electrically connected to one of the diffusion regions of the MOS transistor formed in the semiconductor layer 2, for example, the drain region, through a contact hole 8 formed in the insulating film 4. Under the capacitor electrode conductive layer 6 the cell plate layer 12 is stacked through the capacitor insulating film layer 10. Under this cell plate layer 12 a smoothing (flat) film layer 14 is stacked. The smoothing film layer 14 is heat bonded to the supporting substrate 16.

Note that while not illustrated, on the other side of the semiconductor layer 2 facing the insulating layer 4, there are formed a gate insulating layer, gate electrodes which are formed on the gate insulating layer and used as word lines, an interlayer insulating layer, and bit lines perpendicularly intersecting the word lines. The bit lines are connected to the source region formed in the semiconductor layer 2.

By the above structure, a DRAM memory cell is constructed having a MOS transistor functioning as a transfer gate and the above capacitor functioning as a data storage element.

For such a DRAMdevice having a projecting capacitor to be increased in the capacitance of the capacitor to the value required for a memory device, one may increase the radius of the projected capacitor electrode conductive layer 6 or make the film thicker. The size of the radius, however, is limited from the viewpoint of the degree of integration, so the thickness should be increased. If the thickness of the capacitor electrode conductive layer 6 (the height of the projection) is increased, it is possible to increase the area of the insulating film layer 10, the capacitor electrode conductive layer 6, and the cell plate layer 12 facing the insulating film layer 10 and possible to increase the capacitance of the capacitor.

Along with increasing the thickness of the capacitor electrode conductive layer 6, a large step-difference (strong step difference) 18 is formed corresponding to the thickness (height) of the capacitor electrode conductive layer 6 at the boundary of a cell formation region A, where the array of the capacitor electrode conductive layers 6 is formed and a cell nonformation region B, where memory cells are not formed, and positioned around the cell formation region A. Due to this large step-difference 18, the smoothing of the surface by the smoothing film layer 14 formed on the cell plate layer 12 becomes insufficient.

The surface of the smoothing layer 14 must be formed to be extremely smooth (for example, see U.S. Pat. No. 5,096,854).

When cladding the supporting substrate 16 having a smooth surface to the smoothing film layer 14 having the above curved surface, if an air bubble 20 is present between these surfaces, the smoothing film layer 14 and the supporting substrate 16 will not be sufficiently bonded, and hence the problem will be encountered of a reduction in the bonding strength therebetween.

The above example shows an SOI type DRAM device of the cladding type, but the above problems are not limited to the SOI type semiconductor devices such as the SOI type DRAM device. They are also problems in various other semiconductor devices using cladding.

SUMMARY OF THE INVENTION

An object of the present invention is to provide a cladding type semiconductor device which prevents the occurrence of a large step-difference at the cladding surface, thereby prevents the entrainment of air bubbles caused by the step-difference, and is superior in bonding with the supporting substrate facing the smoothing surface.

Another object of the present invention is to provide an SOI type semiconductor device of the cladding type which is superior in bonding with the supporting substrate facing the smoothing surface.

A still another object of the present invention is to provide a process for the production of the abovementioned semiconductor devices.

To achieve the above-mentioned objects, the semiconductor device of the present invention has formed, at a dummy portion of a cell nonformation region around circuit elements, for example, capacitors and transistor circuits, formed in a projecting manner in a cell formation region, a thickness adjusting layer of substantially the same thickness (height) as the projecting circuit elements so that no step-difference is caused between the cell formation region and the cell nonformation region. Since there is no step-difference even if a smoothing layer is formed at the underlying layer where the circuit elements are formed, the smoothness can be ensured, reliable close contact between the smoothing layer and the supporting substrate can be ensured, and therefore the bonding of the smoothing layer and the supporting substrate is improved.

The above-mentioned circuit elements and thickness adjusting layer are preferably formed by the same step by the same material at the same time.

When the thickness adjusting layer is formed by a conductive material, its potential is preferably fixed to a predetermined potential within the range from the ground level to the power source voltage.

Further, the above-mentioned thickness adjusting layer and some of the circuit elements, like the capacitor counter electrode layer, are preferably connected electrically. In this case, it is possible to take out the electrical wiring of some of the circuit elements from the back surface of the semiconductor device without going through the above-mentioned semiconductor layer.

More preferably, an insulating layer is formed between the semiconductor layer and the above-mentioned circuit elements to form an SOI structure.

In an SOI type semiconductor device, preferably a contact hole is opened in the insulating layer and the circuit elements and the semiconductor layer are electrically connected.

Preferably, an additional semiconductor layer equivalent to the above-mentioned semiconductor layer is formed on the insulating layer, a second contact hole is formed in the insulating layer, and the additional semiconductor layer and thickness adjusting layer are electrically connected. More preferably, the potential of the thickness adjusting layer is adjusted to adjust the threshold value of the transistor formed in the semiconductor layer.

Further, according to the present invention, there is provided a semiconductor device including a semiconductor layer, a circuit formation layer formed in a projecting manner on one surface of the semiconductor layer, and a thickness adjusting layer formed to substantially the same thickness as the circuit formation layer on the insulating layer around the projecting circuit formation layer.

Further more, according to the present invention, there is provided an SOI type semiconductor device including a semiconductor layer, a circuit formation layer formed in a projecting manner on the insulating layer, and a thickness adjusting layer formed to substantially the same thickness as the circuit formation layer on the insulating layer around the projecting circuit formation layer.

According to the present invention, further, there is provided an SOI type semiconductor device including a semiconductor layer having a pair of diffusion regions constituting a transistor, an insulating layer formed on one surface of the semiconductor layer, a gate insulating layer formed on the other surface of the semiconductor layer, a gate electrode layer formed on the gate insulating layer, a circuit formation layer formed in a projecting manner, formed on the insulating layer formed on the one surface of the semiconductor layer and connected to one of the diffusion regions through a contact hole formed in the insulating layer, and a thickness adjusting layer formed to a thickness substantially the same as the circuit formation layer at the insulating layer around the projecting circuit formation layer.

Further, according to the present invention, there is provided a process for producing the above semiconductor device, including the step of forming an insulating layer on one surface of a semiconductor layer, a step of forming a circuit element formation layer having circuit elements in a projecting manner on the insulating layer, and a step of forming a thickness adjusting layer to substantially the same thickness as the circuit element formation layer on the insulating layer around the region where the circuit elements are formed.

BRIEF DESCRIPTION OF THE DRAWINGS

The above-mentioned objects and features of the present invention and other objects and features will become clearer by the following description, given in relation to the accompanied drawings, wherein:

FIGS. 3a to 3l are views of the process of production of the SOI type DRAMdevice illustrated in FIG. 1;

DESCRIPTION OF THE PREFERRED EMBODIMENTS

Figure 2:
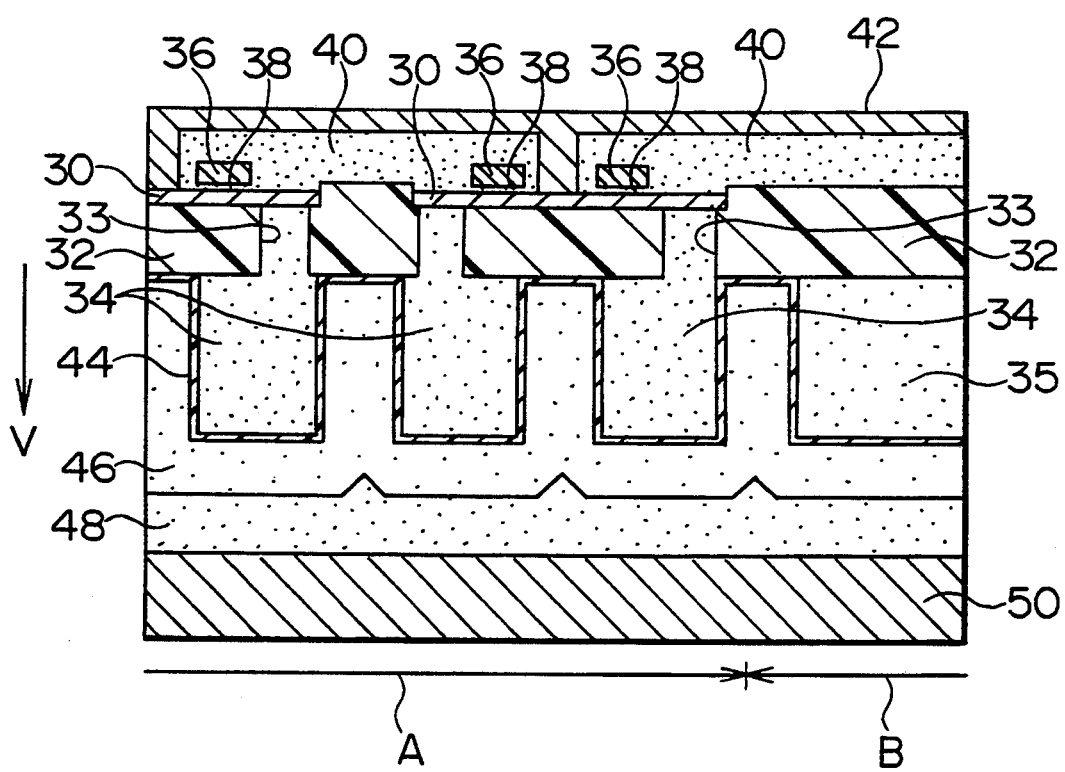
FIG. 2 is a partial sectional view of an SOI type DRAMdevice according to a first embodiment of the present invention.

FIG. 2 is a partial sectional view of a DRAM device using an SOI structure as an example of an SOI type semiconductor device of the cladding type according to the present invention.

This DRAMdevice has a semiconductor layer 30 comprising a silicon monocrystal etc. and having two diffusion regions of a MOS transistor, that is, a drain region and source region, formed therein, and an insulating film layer 32 formed of silicon dioxide ($SiO_2$) or silicon nitride (SIN) etc. That is, the DRAMdevice has an SOI structure wherein the semiconductor layer 30 is formed on the insulating layer 32.

On top of the semiconductor layer 30 a predetermined pattern of gates of a gate electrode layer 36 serving as the word lines of the DRAMdevice are stacked through a thin gate insulating layer 38 of about 100 to 200Å. The gate insulating layer 38 is formed by, for example, a silicon dioxide film formed by the heat oxidation method. The gate electrode layer 36 is formed by, for example, a polycrystalline silicon layers grown by the CVD method. On the semiconductor layer 30 positioned at the lower two side ends of the gate electrode layer 36, a source region and a drain region of a MOS transistor functioning as a transfer gate of a memory cell are formed. The source region and the drain region are formed by, for example, ion implantation of impurities into the semiconductor layer 30.

On the semiconductor layer 30 and insulating film 32, an interlayer insulating film layer 40 is formed surrounding the gate insulating layer 38 and the gates of the gate electrode layer 36 formed on the gate insulating layer 38. The interlayer insulating film layer 40 is comprised, for example, of silicon dioxide or silicon nitride formed by the CVDmethod. At the top of the interlayer insulating film layer 40, bit lines 42 of a DRAMdevice are formed in a predetermined pattern perpendicularly intersecting the gates of the gate electrode film 36 functioning as the word lines. The bit lines 42 are connected to a drain region (or source region) formed in the semiconductor layer 30. An insulating layer etc. (not shown) are further formed on the bit lines 42.

Under the insulating layer 32, capacitor electrodes (conductive nodes) of a conductive layer 34 constituting parts of capacitors are formed so as to project from the insulating layer 32 in an array in a predetermined pattern in a "memory cell formation region (hereinafter referred to as a 'cell formation region') A" comprised of MOS transistors and capacitors. The capacitor electrodes of the conductive layer 34 are connected to a source region (or drain region) formed in the semiconductor layer 30 through contact holes 33 formed in the insulating film layer 32. Around the capacitor electrodes of the conductive layer 34, there is stacked a conductive cell plate layer 46 formed facing the capacitor insulating film layer 44 and the capacitor electrodes of the conductive layer 34 and functioning as a capacitor counter electrode. The capacitor insulating film layer 44 is formed of a usual insulating film material, for example, silicon dioxide, silicon nitride, or stacked films of the same. The conductive cell plate layer 46 is, for example, a polycrystalline silicon formed by the CVDmethod, but it may also be formed using other equivalent conductive materials.

Under the conductive cell plate layer 46 a smoothing (flat) layer 48 which is formed, for example, of polycrystalline silicon and with a surface smoothed by polishing etc. is stacked. Under the smoothing layer 48 a supporting substrate 50 is clad by heat bonding etc. The supporting substrate 50 is, for example, a silicon wafer etc.

The conductive cell plate 46 covers the capacitor insulating film layer 44 and buries the depressions (recesses) between the adjoining projecting capacitor electrodes of the conductive layer 34 and between the capacitor electrodes of the conductive layer and the dummy pattern layer 35. It is formed with a certain smoothness with the smoothing layer 48 formed under the capacitor electrode cell plate layer 46, for which extreme smoothness is demanded, and functions as an interposed layer between the capacitor insulating film layer 44 and dummy pattern 35 and the smoothing layer 48.

In an SOI type DRAMdevice of the cladding type according to a first embodiment, a dummy pattern layer 35 of the same material and substantially the same thickness (height) as the capacitor electrodes of the conductive layer 34, which are formed in a projecting manner and constitute parts of capacitors, is formed in the "cell nonformation region B", where memory cells are not formed. This dummy pattern layer 35 is positioned around the "cell formation region A", where an array of MOS transistors and capacitors are formed. As a result, even if the thickness of the capacitor electrodes of the conductive layer 34 increases along with the increased capacitance of the capacitors, there is no longer any large step-difference (strong step-difference) as in the past formed at the boundary of the "cell formation region A" where the memory cells are formed and the "cell nonformation region B" and therefore it is possible to secure smoothness of the capacitor counter electrode cell plate 46. As a result, the smoothing layer 48 formed close to the capacitor electrode cell plate 46 can be easily formed smooth with a high precision.

Figure 1:
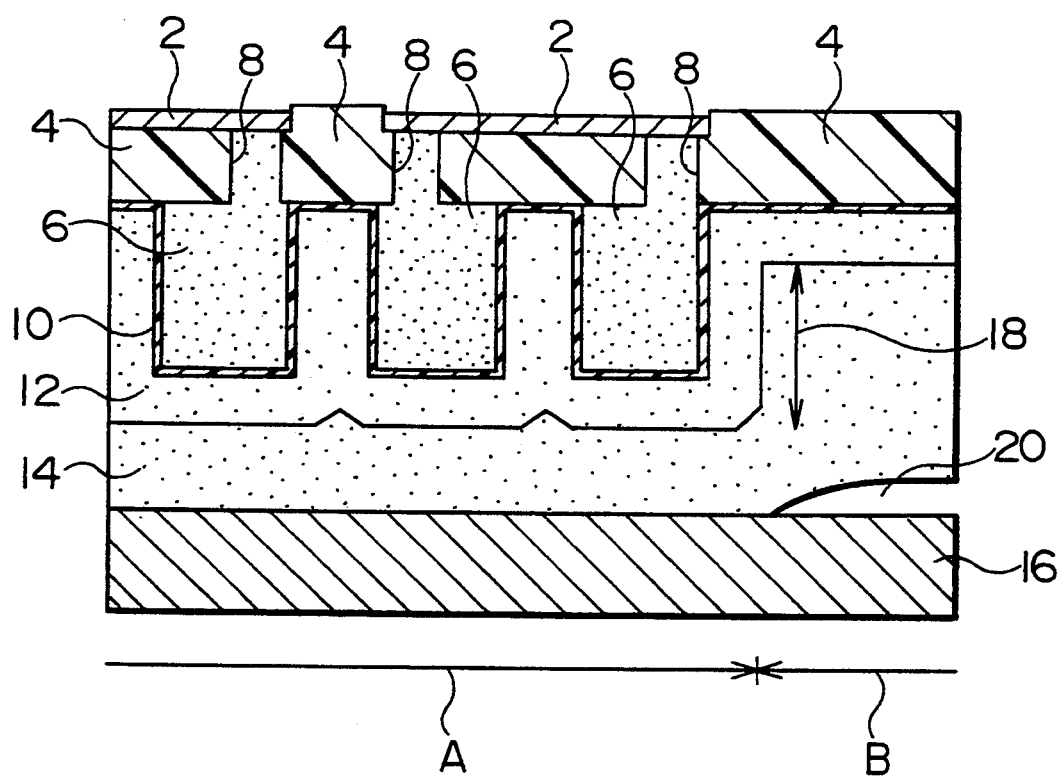
FIG. 1 is a partial sectional view of a conventional SOI type DRAMdevice.

Therefore, according to this embodiment, air bubbles (air bubble 20 in FIG. 1) no longer occur at the bonding interface of the smoothing layer 48 and the supporting substrate 50, the smoothing layer 48 and the supporting substrate 50 are uniformly bonded, and the bonding strength of the smoothing layer 48 and supporting substrate 50 is improved.

An example of the process of production of an SOI type DRAM device of the cladding type mentioned above is explained with reference to FIG. 3a to FIG. 3l. The structure of the DRAMdevice illustrated in FIG. 2 and the structure of the DRAMdevice shown in FIG. 3a to FIG. 3i are, however, reversed vertically. First, the method shown in FIG. 3a to FIG. 3i is used to produce a DRAM device in the direction of the arrow mark V reversed vertically from the structure illustrated in FIG. 2, then, as shown in FIGS. 3j to 3l, a DRAM device is produced in the vertical direction similar to that shown in FIG. 2.

Figure 3A:
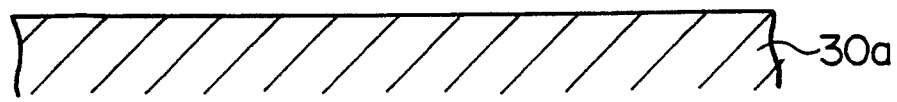

As shown in FIG. 3a, a semiconductor substrate 30a of a silicon monocrystal etc. is prepared to serve as the semiconductor layer 30.

Figure 3B:
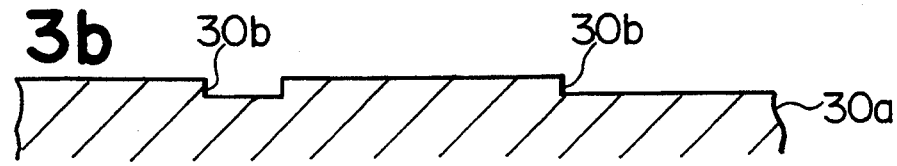

As shown in FIG. 3b, element isolation grooves 30b are formed on the surface of the semiconductor substrate 30a into a predetermined pattern using photolithography etc.

Figure 3C:
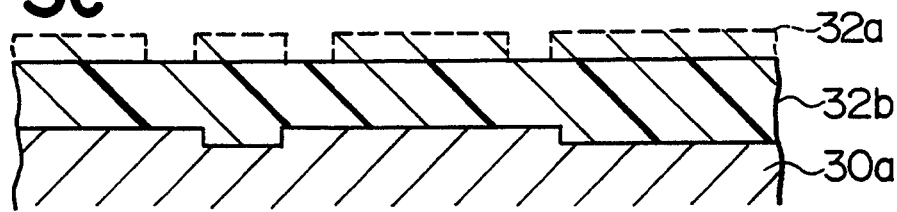

As shown in FIG. 3c, an insulating film layer 32a is deposited to the thickness, which is shown by the broken line by, for example, the CVDmethod, on the semiconductor substrate 30a where the element isolation grooves 30b are formed, then is etched back to the thickness shown by the solid line to form a smooth insulating film layer 32b. The thickness of the insulating film layer 32 is, for example, about 1 μm.

Figure 3D:
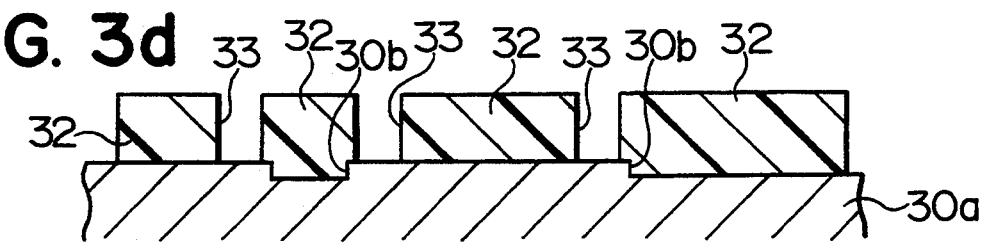

As shown in FIG. 3d, contact holes 33 are formed in a predetermined pattern in the insulating film layer 32. By this, an insulating layer 32 with contact holes 33 is formed. The contact holes 33 are formed by, for example, photolithography. Mask alignment is performed to the position of formation of the element isolation grooves 30b.

Figure 3E:
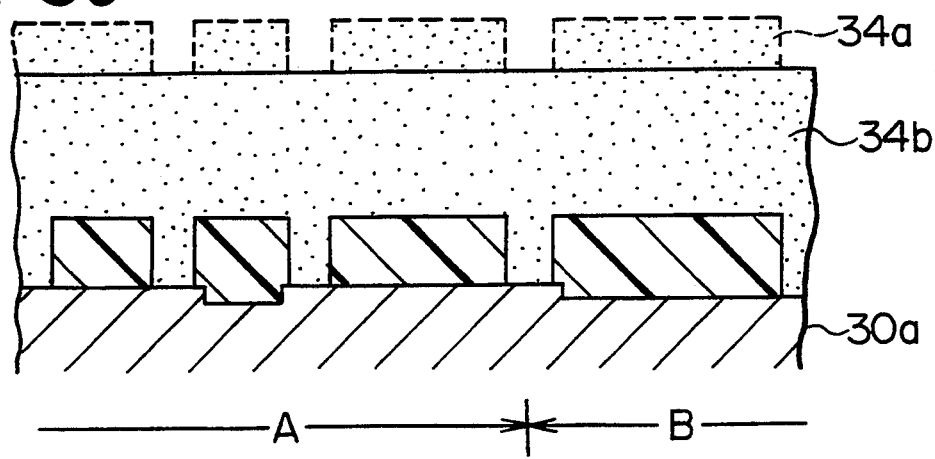

As shown in FIG. 3e, a polycrystalline silicon layer 34a is deposited on the insulating film 32 and is etched back to the thickness shown by the solid line to form a smooth conductive layer 34b. The conductive layer and the dummy pattern layer 35 are preferably doped by the ion implantation method with phosphorus or another impurity so as to improve the conductivity.

As shown in FIG. 3f, the conductive layer 34b is subjected to a photolithographic process to form a predetermined pattern so as to form an array of projecting capacitor electrodes of the conductive layer 34 in the cell formation region A and a dummy pattern layer 35 in the cell nonformation region B. That is, the capacitor electrodes of the conductive layer 34 and the dummy pattern layer 35 are formed by the same step, by the same conductive material, at the same time. The thicknesses of the capacitor electrode of the conductive layer 34 and the dummy pattern layer 35 are substantially the same. The thicknesses of the capacitor electrodes of the conductive layer 34 are determined by the capacitance of the capacitors formed, but for example is about 2 μm in this example. Note that the capacitor electrodes of the conductive layer 34 formed in the cell formation region A and the dummy pattern layer 35 desirably should be provided sufficiently close to each other. In a later explained step, a capacitor insulating film 44 is formed on the capacitor electrodes of the conductive layer 34 and dummy pattern 35 for insulation, so the distance d between the capacitor electrodes of the conductive layer 34 and the dummy pattern 35 may be made small. Note that the reason for making the distance d small is to prevent any gap between patterns remaining between the capacitor electrodes of the conductive layer
and the dummy pattern layer 35 when forming the cell plate layer 46 and smoothing layer 48 by the later steps. The distance d between the capacitor electrodes of the conductive layers 34 and dummy pattern layer 35 depends on the degree of integration of the SOI type DRAMdevice as well, but specifically one less than 1 μm is desirable in this example.

As shown in FIG. 3g, a capacitor insulating film layer 44 is formed on the capacitor electrodes of the conductive layer 34 and the dummy pattern 35 processed to a predetermined projecting pattern. The insulating film layer 44 is formed by, for example, silicon nitride or silicon dioxide (SiO$_2$).

As shown in FIG. 3h, a conductive cell plate layer 46 which is formed of a polycrystalline silicon layer doped with phosphorus or other impurities, is deposited on the insulating film layer 44 by the CVDmethod etc. The thickness of the cell plate layer 46 is, for example, about 400 nm.

The capacitor electrodes of the conductive layer 34, the insulating film 44, and the cell plate layer 46 constitute capacitors storing the data in the memory cells of an SOI type DRAMdevice.

Figure 3I:
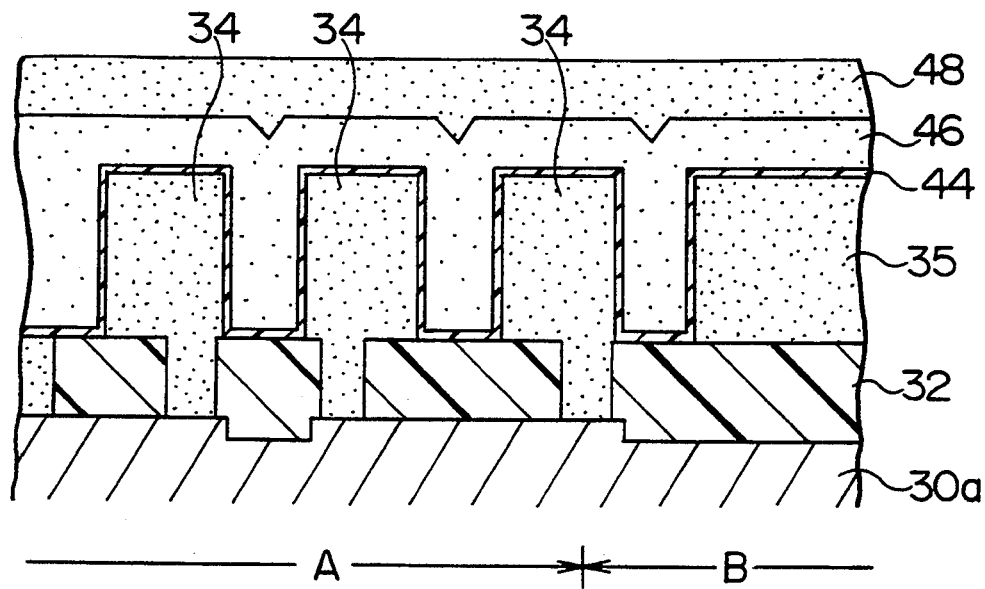
Figure 3J:
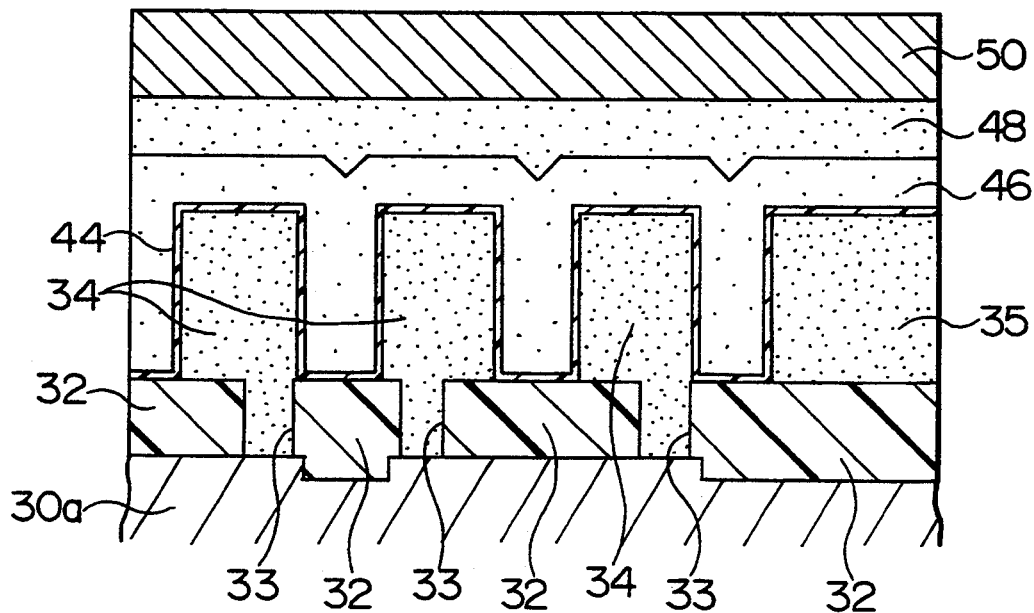
Figure 3K:
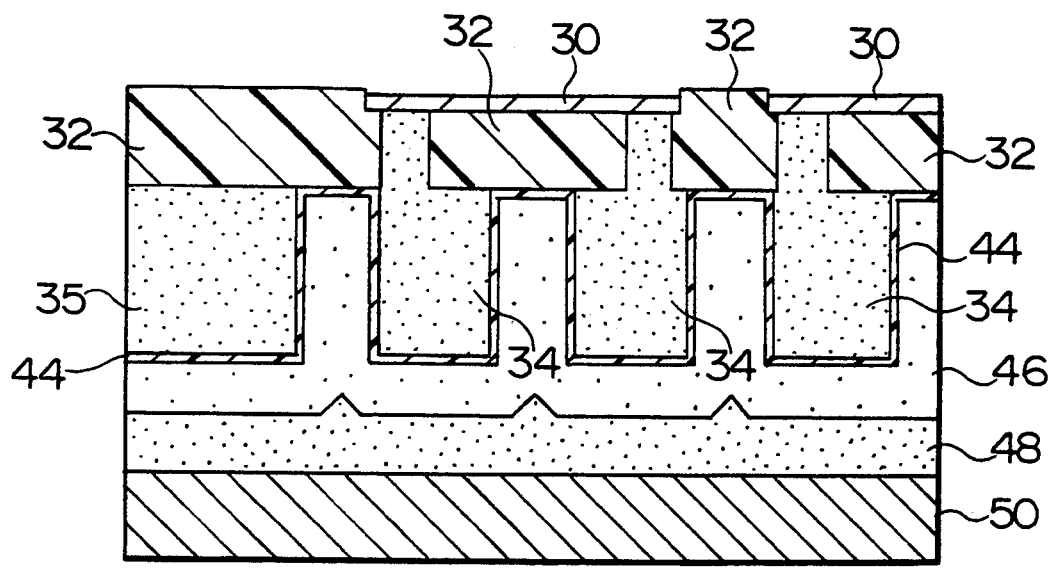
Figure 3L:
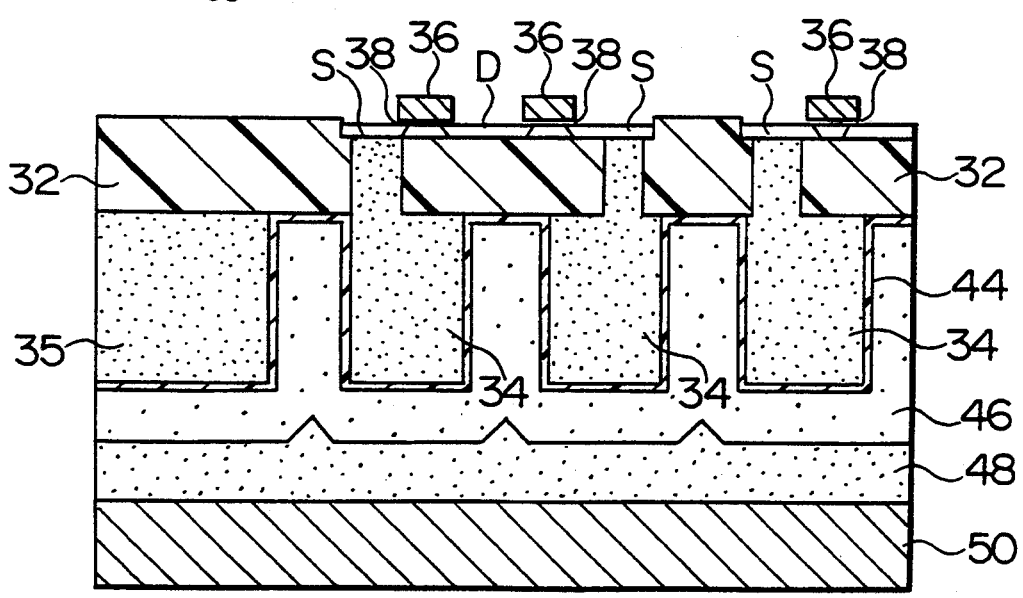

As shown in FIG. 3i, polycrystalline silicon is further deposited on the cell plate layer 46 by the CVD method etc., the surface of the same is polished to smooth it, and thus a smoothing layer 48 is formed. As the method of smoothing, for example, the smoothing method based on U.S. Patent No. 5,096,854 is suitable.

As shown in FIG. 3j, a supporting substrate 50 which is a semiconductor wafer etc. is heat bonded to the surface of the smoothing layer 48. The heating temperature for the heat bonding is for example about 1000° C.

As shown in FIG. 3k, after the above step, the partially formed semiconductor device is turned upside-down, the semiconductor substrate 30a is polished, and a semiconductor layer 30 of a predetermined pattern suitable for the formation of MOS transistors is thereby formed.

As shown in FIG. 3, after the semiconductor layer 30 is formed, a gate insulating layer 38 of a thickness of about 100 to 200Å is formed on top and then gate electrodes (word lines) of a gate layer 36 are formed on top of that. Further, ion implantation is performed to form the source regions and drain regions in the semiconductor layer 30 and form the two diffusion regions of MOS transistors. After this, an interlayer insulating film layer 40 is formed and the bit lines 42 are formed on top of that. The bit lines 42 are connected to the drain regions (or source regions) formed on the semiconductor layer 30. Further, an insulating layer is formed, thereby completing the DRAMdevice.

The capacitor electrodes of the conductive layer 34, the capacitor insulating film 44, and the cell plate layer 46 functioning as the capacitor counter electrode conductive layer constitute a capacitor and the drain region and source region formed in the semiconductor layer 30 and the gate electrode 36 constitute a MOS transistor, thereby forming a unit circuit of a memory cell.

In this way, since the dummy pattern 35 functioning as the thickness adjusting layer for eliminating the step difference with the capacitor electrodes of the conductive layer 34 is formed by the same step, the process of production of the dummy pattern 35 becomes easier.

Note that the dummy pattern layer 35 functioning as the thickness adjusting layer need not have conductivity and may be formed of an insulating material as well. If the dummy pattern layer 35 is formed by an insulating material, the insulation between the memory cells is improved.

Figure 4:
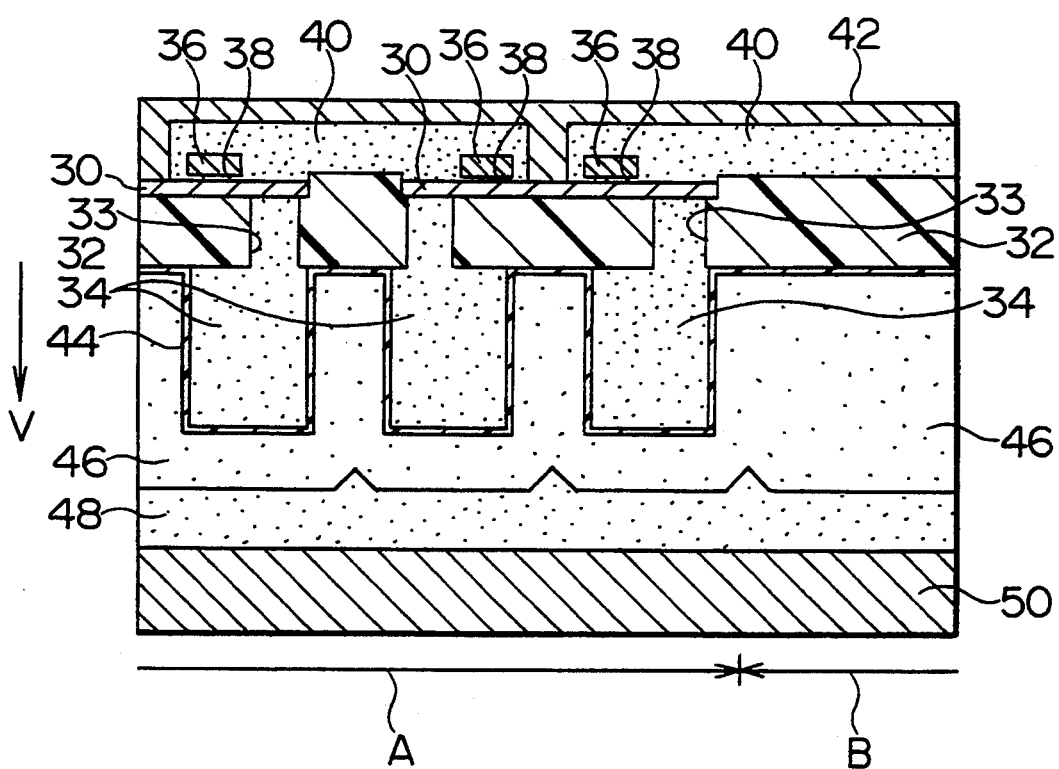
FIG. 4 is a partial sectional view of a DRAMdevice according to a modification of the first embodiment of the present invention.

Further, there is no need to form the dummy pattern layer 35 and the capacitor electrodes of the conductive layer 34 simultaneously. So long as the method eliminates the step-difference at the boundary of the cell formation region A and the cell nonformation region B, it is possible to use a step-different from the abovementioned step, for example, as illustrated in FIG. 4, to deposit a capacitor counter electrode cell plate layer 46 sufficiently enough to eliminate the step-difference at the cell nonformation region B and etch back to the thickness shown in FIG. 3h to form a layer corresponding to the dummy pattern layer 35.

An SOI type DRAMdevice of the cladding type of a second embodiment of the present invention will be explained next referring to FIG. 5.

Figure 5:
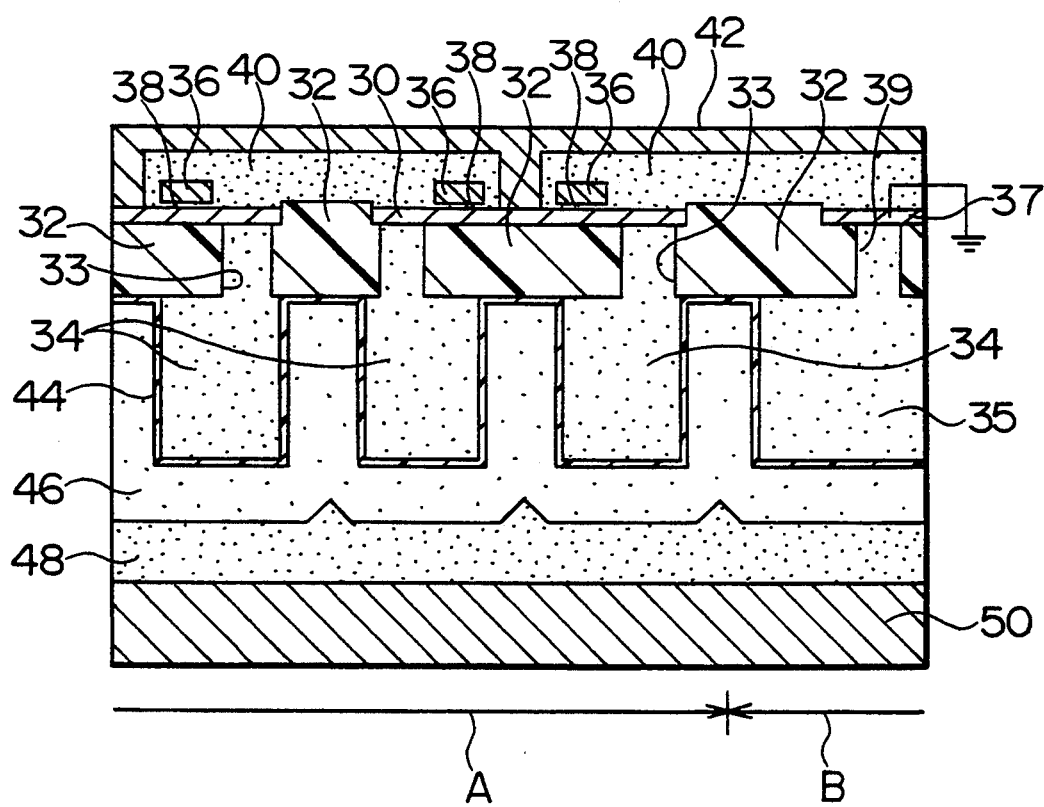
FIG. 5 is a partial sectional view of an SOI type DRAM device according to a second embodiment of the present invention.

The DRAM device of the second embodiment shown in FIG. 5 simultaneously forms on the insulating layer 32 above the dummy pattern 35, which was formed on the cell nonformation region B a contact hole 39 similar to the contact holes 33, which was formed in the insulating layer 32 of the cell formation region A, and, further, simultaneously has above the insulating layer 32 of the cell nonformation region B an electrode layer 37, which is a similar semiconductor layer as the semiconductor layer 30 of the cell formation region A and is formed in the same way as the semiconductor layer 30. The electrode layer 37 and the dummy pattern layer 35 are connected through the contact hole 39.

In the DRAMdevice of the second embodiment, there is the advantage that it is possible to allow the floating charge stored in the conductive dummy pattern layer 35 to escape through the electrode layer 37 during the production process or use of the DRAMdevice. That is, by fixing the potential of the electrode layer 37 to a predetermined potential in the range from the ground level to the power source voltage, it is possible to fix the potential of the conductive dummy pattern 35, so it is possible to stabilize the characteristics of the transistor of the surrounding circuit portion, such as the sense amplifier, of the DRAMdevice to be formed on the dummy pattern 35 through an interlayer insulating film (not shown).

More preferably, it is possible to adjust the threshold voltage V=h of the MOS transistor by adjusting the potential of the conductive dummy pattern 35. As a result, it is possible to realize a MOS transistor with the desired threshold value. Therefore, it is possible to reduce the operating voltage of a DRAM device, for example.

An SOI type DRAM device of the cladding type of a third embodiment of the present invention will be explained with reference to FIG. 6.

Figure 6:
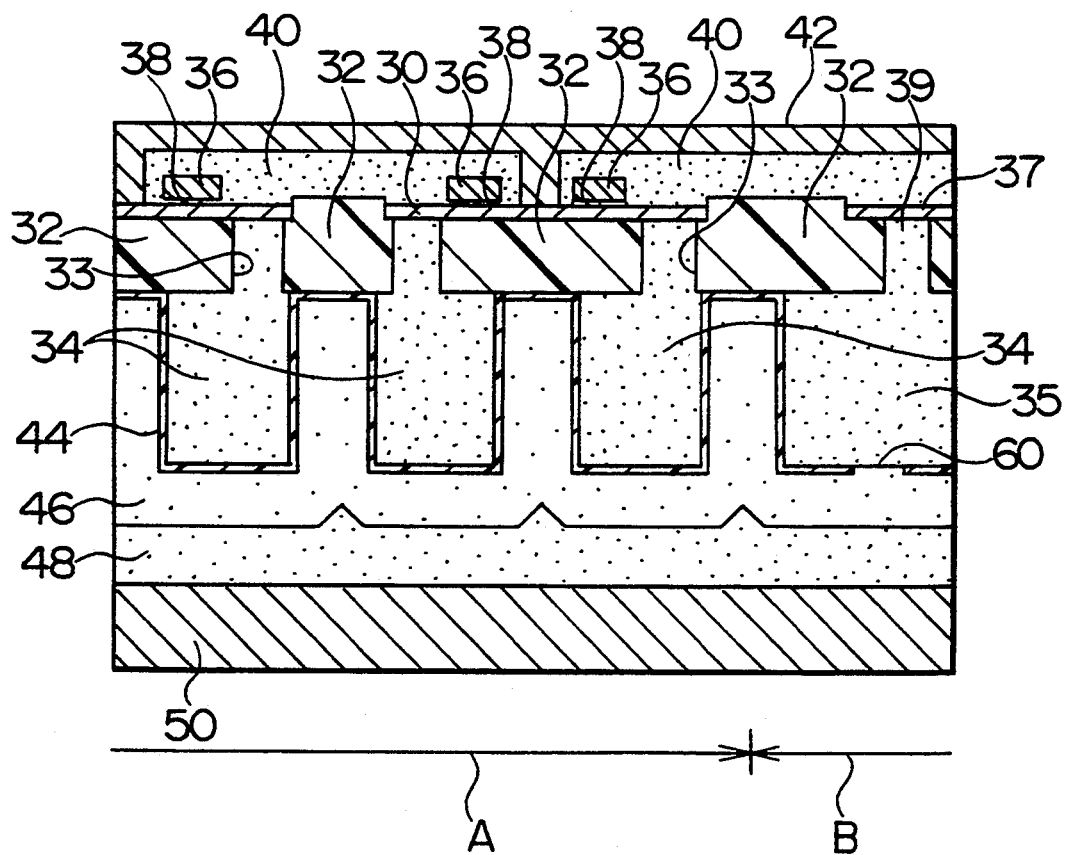
FIG. 6 is a partial sectional view of an SOI type DRAMdevice according to a third embodiment of the present invention.

The DRAM device illustrated in FIG. 6 is provided with a contact hole 39 and electrode layer 37 at the cell nonformation region B in the same way as the DRAM device of the second embodiment shown in FIG. 4. At the portion of the cell nonformation region B, part of the insulating film layer 44 is removed by the photolithographic method, a connecting hole 60 is provided, and the conductive cell plate layer 46 and conductive dummy pattern layer 35 are electrically connected.

In the case of the DRAM device of the third embodiment, there is the advantage that it is possible to take out the counter electrode of the conductive cell plate layer 46 from the front surface of the DRAM device through the conductive dummy pattern layer 35, the contact hole 39, and the electrode layer 37. Therefore, there is no longer a need for taking out the electrode of the cell plate 46 from the supporting substrate 50 side and there are no longer restrictions on the cladding method of the supporting substrate 50 or the packaging of the DRAM device. More specifically, for example, there is no longer a need to form the smoothing layer 48 and the supporting substrate 50 by a film or substrate of a conductive material and, further, it is possible to use the step of bonding the supporting substrate by low temperature bonding through a film of a material such as BPSG, so the production of the DRAM device becomes easier. Further, as the package, a lead on chip structure etc. may be used without using die pads.

Figure 7:
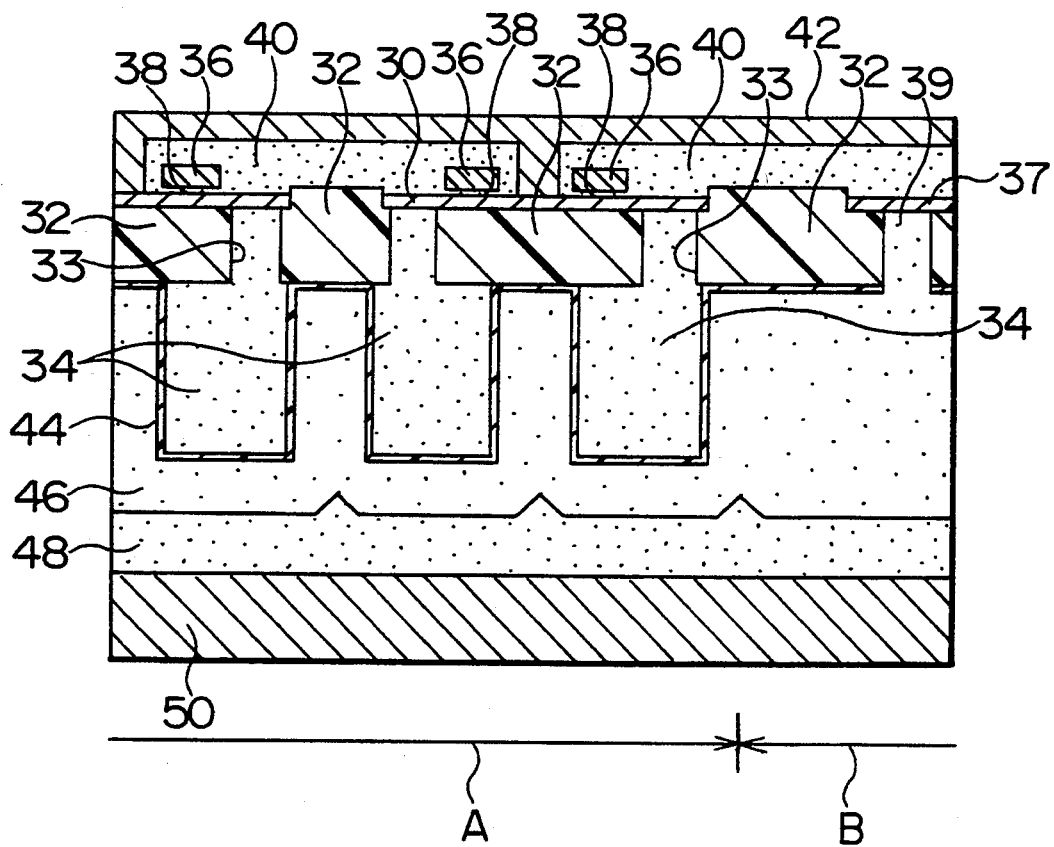
FIG. 7 is a partial sectional view of a DRAMdevice according to a modification of the third embodiment of the present invention.

FIG. 7 shows a DRAM device of a modification of the third embodiment. The DRAM, explained in reference to FIG. 4 as a modification of the first embodiment, is formed for example by depositing a capacitor counter electrode cell plate layer 46 sufficiently thickness enough so that there is no longer a step-difference at the cell nonformation region B, etching back to the thickness shown in FIG. 3h, and forming a layer corresponding to the dummy pattern layer 35 as part of the capacitor counter electrode cell plate layer 46. In this structure, there is no need to form a contact hole 60 under the capacitor insulating film layer 44 in the DRAM device shown in FIG. 6.

As explained above, according to the SOI type DRAM device according to the embodiments of the semiconductor device of the present invention, a dummy pattern layer 35 of preferably the same materials as the capacitor electrodes of the conductive layer 34 constituting parts of the charge storage capacitors and of substantially the same thickness as the capacitor electrodes of the conductive layer 34 is formed at a cell nonformation region B outside of a cell formation region A where an array of charge storage capacitors is formed, so even if the thickness of the capacitor electrodes of the conductive layer 34 increases along with an increase in the capacitance of the capacitors, there is no longer formation of a large step-difference (strong step-difference) at the boundary of the cell formation region and cell nonformation region and smoothing by the smoothing layer becomes more accurate and easier. As a result, air bubbles no longer occur at the interface between the smoothing layer and supporting substrate and the bonding strength is improved.

The present invention is not limited to the above embodiments and can be modified in various ways within the scope of the invention.

For example, the region where the capacitors are formed need not be an array as mentioned above. Even when the capacitors are formed in a nonarray manner, a thickness adjusting layer similar to the dummy pattern 35 may be formed so as to eliminate the step-difference at the recess portion around the same.

Note that the capacitor electrodes of the conductive layer 34 and the dummy pattern layer 35 do not necessarily have to be made of the same material. In the above example of production, the capacitor electrodes of the conductive layer 34 and the dummy pattern layer 35 are formed in the same step, so the capacitor electrodes of the conductive layer 34 and the dummy pattern layer 35 are formed of the same material. There is, however, no need for forming the dummy pattern layer 35 by a conductive material like the capacitor electrodes of the conductive layer 34 and it is also possible to form it by an insulating material to improve the isolation of the elements.

The figures for the thickness etc. given above were illustrative. It is possible to design to a suitable size in accordance with the dimensions of the semiconductor device.

As a preferable embodiment of the semiconductor device of the present invention, a DRAMdevice having an SOI structure of the cladding type was illustrated, but the structure of the semiconductor device according to the present invention is not limited to an SOI type DRAM device of the cladding type and may be applied to various types of semiconductor devices.

As another example of the application of the present invention, for example, there is a steric (three dimensional) static RAM (SRAM) device. In the case of the SRAM device, projecting capacitors are unnecessary as in DRAM devices, but when a number of transistors are formed under the insulating film layer 32, the step-difference with the area around the cell formation region becomes a problem in the same way as above. In this case too, a thickness adjusting layer is formed at the cell nonformation region in the same way as the above embodiment.

Of course, the present invention is not limited to application to a memory device. In short, the present invention basically may be applied to various other semiconductor devices requiring the elimination of step-differences between a steric circuit formation region and a steric circuit nonformation region around the same when forming a circuit sterically along with the increasing density of cells.

From this viewpoint, the present invention is not limited to application to a semiconductor device having an SOI structure. Also, it is not limited to application to a semiconductor device using cladding. Needless to say, the present invention can also be widely applied to the prevention of step-differences in steric structure semiconductor devices.

Many widely different embodiments of the present invention may be constructed without departing from the spirit and scope of the present invention, and it should be understood that the present invention is not restricted to the specific embodiments described above.

What is claim is:

1. A semiconductor memory device comprising:
   a semiconductor layer on a first insulating layer;
   a capacitor including a capacitor electrode conductive layer formed in a projecting manner in a cell formation region on one surface of said insulating layer and in contact with said semiconductor layer, a capacitor insulating film formed on the surface of said capacitor electrode conductive layer, and a capacitor counter electrode conductive layer formed on the surface of the capacitor insulating film;
   a smoothing layer cladded to a supporting substrate being on the capacitor counter electrode conductive layer;
   a thickness adjusting layer of a conductive material being formed in a cell nonformation region around said cell formation region between the insulating layer and the smoothing layer and having a thickness substantially the same as the thickness of said capacitor electrode conductive layer so that the smoothing layer has a thickness free of any steps;
   said capacitor counter electrode conductive layer covering both said capacitor insulating film and said thickness adjusting layer; and
   a second insulating layer being formed between said thickness adjusting layer and said capacitor counter electrode conductive layer, wherein a potential of said thickness adjusting layer being set to a predetermined value between a ground potential and a power source voltage of said semiconductor memory device.

2. A semiconductor memory device as set forth in claim 1, wherein a third contact hole is formed in said second insulating layer, and whereby said thickness adjusting layer and said capacitor counter electrode conductive layer are connected through said contact hole.

3. A semiconductor memory device as set forth in claim 1, wherein
   a pair of diffusion regions functioning as drain region and source region of a transistor are formed in said semiconductor layer, and
   a gate electrode of said transistor is formed through a gate insulating-film at the other surface of the said semiconductor layer.

4. A semiconductor memory device as set forth in claim 3, wherein
   said capacitor functions as a data storage element, and
   said capacitor electrode conductive layer is formed to a thickness for securing the charge storage required for said memory storage element.

5. A semiconductor memory device as set forth in claim 4, where a bit line is formed on the source region of said transistor.

6. A semiconductor memory device as set forth in claim 5, wherein
   said cell formation region is arranged in an array, and
   said cell nonformation region is defined by the area around the said array.

7. In a semiconductor memory device having a gate electrode layer of a transistor formed on one surface of a semiconductor layer on which a set of diffusion regions constituting said transistor are formed; a charge storage capacitor including a capacitor electrode conductive layer being formed in a projecting manner on the other surface of said semiconductor layer, a capacitor insulating film being formed on a surface of said capacitor electrode conductive layer, and a capacitor counter electrode conductive layer being formed on a surface of said capacitor insulating film; a smoothing layer being formed on the capacitor; and a supporting substrate being cladded to the smoothing layer, the improvements comprising a dummy pattern layer being formed of the same material as said capacitor electrode conductive layer and with substantially the same thickness as said electrode Conductive layer in a cell nonformation region around a cell formation region where said transistor and capacitor are formed, said smoothing layer being formed under said capacitor electrode conductive layer and said dummy pattern layer, and said dummy pattern layer being electrically connected to said capacitor counter electrode conductive layer.

8. A semiconductor memory device as set forth in claim 7, wherein said dummy pattern layer is set to a certain potential in a range from the ground level to a power source voltage of said semiconductor memory device.

9. A semiconductor memory device comprising:
   a semiconductor layer on a first insulating layer;
   a capacitor including a capacitor electrode conductive layer formed in a projecting manner in a cell formation region on one surface of said insulating layer and in contact with said semiconductor layer, a capacitor insulating film formed on the surface of the said capacitor electrode conductive layer, and a capacitor counter electrode conductive layer formed on the surface of the said capacitor insulating film;
   a smoothing layer cladded to supporting substrate being on the capacitor counter electrode conductive layer; and
   said capacitor counter electrode conductive layer having a thickness adjusting portion formed in a cell nonformation region around said cell formation region and having a thickness equal or approximately equal to the thickness of said capacitor so that the smoothing layer is free of any steps.

* * * * *